US010288768B2

(12) United States Patent
Bai et al.

(10) Patent No.: US 10,288,768 B2
(45) Date of Patent: *May 14, 2019

(54) METHOD AND APPARATUS FOR LIGHTNING FORECAST

(71) Applicant: Utopus Insights, Inc., Valhalla, NY (US)

(72) Inventors: Xin Xin Bai, Beijing (CN); Jin Dong, Beijing (CN); Hui Du, Beijing (CN); Xiao Guang Rui, Beijing (CN); Hai Feng Wang, Beijing (CN); Bao Guo Xie, Beijing (CN); Wen Jun Yin, Beijing (CN); Meng Zhang, Beijing (CN)

(73) Assignee: Utopus Insights, Inc., Valhalla, NY (US)

( * ) Notice: Subject to any disclaimer, the term of this patent is extended or adjusted under 35 U.S.C. 154(b) by 318 days.

This patent is subject to a terminal disclaimer.

(21) Appl. No.: 14/749,389

(22) Filed: Jun. 24, 2015

(65) Prior Publication Data
US 2015/0293262 A1    Oct. 15, 2015

Related U.S. Application Data

(63) Continuation of application No. 14/674,574, filed on Mar. 31, 2015.

(30) Foreign Application Priority Data

Mar. 31, 2014   (CN) .......................... 2014 1 0125733

(51) Int. Cl.
*G01R 29/08*    (2006.01)
*G01W 1/10*    (2006.01)
(Continued)

(52) U.S. Cl.
CPC ............... *G01W 1/10* (2013.01); *G01S 13/95* (2013.01); *G01W 1/16* (2013.01); *G01R 29/0842* (2013.01); *Y02A 90/18* (2018.01)

(58) Field of Classification Search
CPC ............................. G01W 1/10; G01R 29/0842
See application file for complete search history.

(56) References Cited

U.S. PATENT DOCUMENTS 6,405,134 B1 * 6/2002 Smith .................... G01S 13/86
                                                    702/4
7,069,258 B1 * 6/2006 Bothwell ................. G06N 7/06
                                                    706/12
(Continued)

FOREIGN PATENT DOCUMENTS

CN        102590651 A    7/2012
CN        103033855 A    4/2013
EP         2339373 A2    6/2011

OTHER PUBLICATIONS

Lu et al., "Forecast method of lightning activity based on the weather conditions," 7th Asia-Pacific International Conference on Lightning (APL), 2011, Nov. 1-4, 2011, http://ieeexplore.ieee.org/xpl/articleDetails.jsp?tp=&arnumber=6110202&queryText%3Dlightning+forecast, Abstract Only.

(Continued)

*Primary Examiner* — Anthan Tran
(74) *Attorney, Agent, or Firm* — Sheppard, Mullin, Richter & Hampton LLP

(57) ABSTRACT

The present invention proposes a lightning forecast method, comprising: identifying a Targeted Weather of SDA carrier (TWLC) based on radar reflectivity data; forecasting a future TWLC state based on the identified TWLC; building or updating an SDA model based on SDA observation data and (Continued)

detected TWLC state-related data; and calculating the probability of producing SDA in the forecasted future TWLC according to the SDA model.

8 Claims, 4 Drawing Sheets

(51) Int. Cl.
  *G01W 1/16* (2006.01)
  *G01S 13/95* (2006.01)

(56) References Cited

U.S. PATENT DOCUMENTS

| | | | |
|---|---|---|---|
| 7,191,064 B1 * | 3/2007 | Myers | G01W 1/10 |
| | | | 702/3 |
| 7,200,491 B1 | 4/2007 | Rose, Jr. et al. | |
| 7,542,852 B1 | 6/2009 | Rose et al. | |
| 2011/0090111 A1 * | 4/2011 | Stagliano, Jr. | G01S 7/025 |
| | | | 342/26 R |
| 2015/0073710 A1 * | 3/2015 | Deierling | G01W 1/16 |
| | | | 702/4 |

OTHER PUBLICATIONS

List of IBM Patents or Patent Applications Treated as Related.

* cited by examiner

METHOD AND APPARATUS FOR LIGHTNING FORECAST

CROSS REFERENCE TO RELATED APPLICATION

This application is a continuation of U.S. patent application Ser. No. 14/674,574, filed Mar. 31, 2015 the entire content and disclosure of which is incorporated herein by reference.

FIELD OF THE INVENTION

The present invention relates to the field of lightning forecast, and more particularly, to a method and apparatus for lightning forecast.

BACKGROUND OF THE INVENTION

With increase of power grid voltage (e.g. 100 KV in China), grid safety is playing an increasingly important role for the society safety. Extreme weather conditions may affect the safety of grid and transmission lines, and even bring disasters. Grid device failures related to lightning may not only bring great economic losses, but may also be life-threatening. Therefore, lightning forecast technology is in high demand.

Currently there are following several lightning forecast methods:

One is a statistic method. The method uses historical meteorological data and Spark Discharge of the Air (SDA) data to build and train a linear model, and then makes forecast based on the model and using forecast variables from a meteorology organization. The disadvantage of this technology is that it is not accurate enough and cannot forecast the SDA intensity, and the linear model cannot forecast well.

Another method is to forecast SDA using radar and based on experience. The method assumes that radar reflectivity greater than 35 db under −15, for example, has a high probability to produce SDA. The method actually can only indicate the probability of producing SDA under the current weather condition, and cannot forecast the probability of producing SDA in a future time.

Still another method is weather model. The method uses a high-resolution weather model to forecast a Targeted Weather of SDA Carrier (TWLC), and then calculates a SDA index based on convective parameters. The drawback of this method is that there is a great error in forecasting the TWLC using the weather model.

Apparently, a more effective lightning forecast method is needed in the art.

SUMMARY OF THE INVENTION

In an aspect of the present invention, there is provided a lightning forecast method, comprising: identifying a Targeted Weather of SDA Carrier (TWLC) based on detected radar reflectivity data; forecasting a future TWLC state based on the identified TWLC; building or updating an SDA model based on SDA observation data and detected TWLC state-related data; and calculating the probability of producing SDA in the forecasted future TWLC according to the SDA model.

In another aspect of the present invention, there is provided a lightning forecast apparatus, comprising: a TWLC identification module configured to identify a Targeted Weather of SDA Carrier (TWLC) based on detected radar reflectivity data; a TWLC forecast module configured to forecast a future TWLC state based on the identified TWLC; an SDA modeling module configured to build or update an SDA model based on SDA observation data and detected TWLC state-related data; and an SDA forecasting module configured to calculate the probability of producing SDA in the forecasted future TWLC according to the SDA model.

The technical solution of the present invention can well realize short-term (e.g., about 30 minutes to 1 hour) SDA forecasting, thus effectively preventing grid device failures caused by lightning.

BRIEF DESCRIPTION OF THE ACCOMPANYING DRAWINGS

FIG. 1 schematically shows the flow of a lightning forecast method according to an embodiment of the present invention;

DETAILED DESCRIPTION OF SPECIFIC EMBODIMENTS

Some preferable embodiments will be described in more detail with reference to the accompanying drawings, in which the preferable embodiments of the present disclosure have been illustrated. However, the present disclosure can be implemented in various manners, and thus should not be construed to be limited to the embodiments disclosed herein. On the contrary, those embodiments are provided for the thorough and complete understanding of the present disclosure, and completely conveying the scope of the present disclosure to those skilled in the art.

Figure 1:
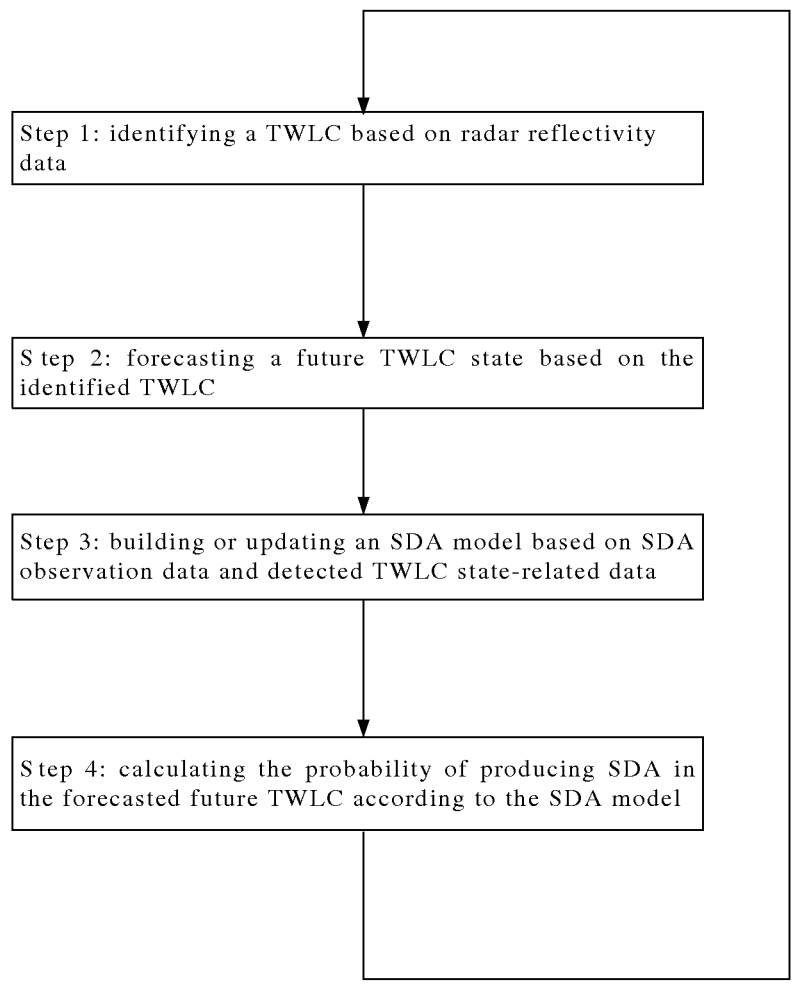

Now referring to FIG. 1, it schematically shows the flow of a lightning forecast method according to an embodiment of the present invention. As shown, the method comprises the following four steps: step 1, identifying a TWLC based on radar data; step 2, forecasting a future TWLC based on the identified TWLC; step 3, building or updating an SDA model; step 4, calculating the probability of producing SDA in the forecasted future TWLC according to the SDA model. In the following will be described the four steps in greater detail respectively.

Step 1: identifying a TWLC based on detected radar reflectivity data. A TWLC refers to an area of a specific weather type where lightning may easily occur, i.e., an area of thunderstorm type. In the present invention, a TWLC may be identified based on radar reflectivity data. As known by those skilled in the art, radar reflectivity refers to the intensity of the radar radio waves reflected from remote objects such as raindrops. According to an embodiment of the present invention, the radar reflectivity data is expressed by dBZ. As known by those skilled in the art, dBZ denotes the decibel value of the relative reflectivity, and it is the logarithmic dimensionless unit of the equivalent reflectivity of the radar signal reflected from remote objects (in cubic millimeters per cubic meter) relative to the radar signal reflected from a raindrop with a diameter of 1 mm (one cubic millimeter per cubic meter). dBZ is in direct proportion to the number of raindrops per unit volume and the sixth power of drops diameter, and thus it may be used to estimate the intensity of rain or snow. According to an embodiment of the present invention, dual criteria are used to identify a TWLC. The first criterion may be set to 35 dBZ, while the second criterion may be set to 45 dBZ. Firstly, reflectivity greater than about 35 dBZ on each height level is extracted based on radar detection results, so as to find an area formed by points with reflectivity greater than about 35 dBZ. Secondly, an area formed by points with reflectivity greater than about 45 dBZ is found (which may be within the area formed by points with reflectivity greater than about 35 dBZ). Lastly, the area formed by points with reflectivity greater than about 45 dBZ is extended to the area formed by points with reflectivity greater than about 35 dBZ, and stops until the reflectivity is about 35 dBZ. Thus, the extended area formed by points with reflectivity greater than about 45 dBZ is obtained. Such areas are identified as different TWLC cells, and they corresponding to different weather sub-systems of a weather system. Of course, as known by those skilled in the art, the 35 dBZ and 45 dBZ in the step are merely empirical values, and other values near these values may also be used to identify a TWLC.

Step 2: forecasting a future TWLC state based on the identified TWLC. That is, for different TWLC cells obtained in step 1, the state of the TWLC cell in some future time (e.g., after about 30 minutes to about 1 hour), i.e. the position and dBZ intensity at the future time of the dBZ intensity (i.e., dBZ value) of each point in the TWLC cell, is forecasted.

Figure 2:
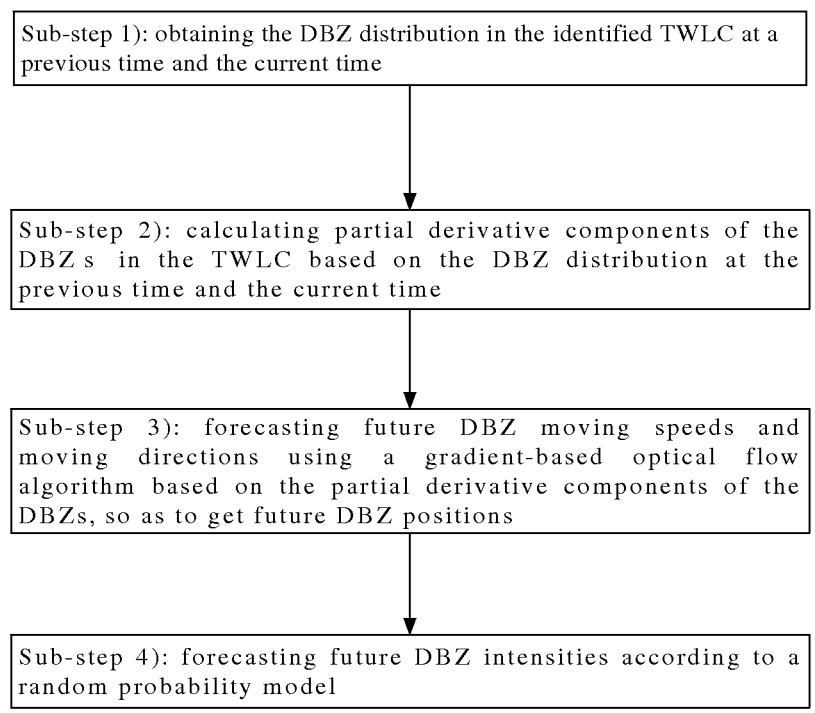
FIG. 2 shows sub-steps included in step 2 according to an embodiment of the present invention.

Now referring to FIG. 2, it shows the sub-steps included in step 2 according to an embodiment of the present invention.

As shown in FIG. 2, sub-step 1): obtaining from the radar detection data the dBZ distribution in the identified TWLC at a previous time (t1) and the current time (t2), i.e., the dBZ values of the points in the identified TWLC at the previous time (t1) and current time (t2), which may be denoted as dBZ (x, y, t1), dBZ (x, y, t2), wherein x and y denote the abscissa and ordinate on the horizontal plane respectively. The previous time may be, for example, the previous second before the current time.

Sub-step 2): obtaining the partial derivative components of the dBZ distribution from the dBZ distribution at the previous time (t1) and the current time (t2), that is:

$$\frac{\partial dBZ(x, y, t)}{\partial x}, \frac{\partial dBZ(x, y, t)}{\partial y}, \frac{\partial dBZ(x, y, t)}{\partial t}$$

Sub-step 3): forecasting a future moving speed and direction of the dBZ distribution using a gradient-based optical flow algorithm.

The technical solution of the present invention forecasts the dBZ values of the points in a TWLC at some future time by using the dBZ values of the points in the current TWLC, assuming that the dBZ values of the points in the current TWLC move relatively stably to other positions over time, and the dBZ values may also change relatively stably (such dBZ values moving their positions and changing over time may be called dBZ points), so that the current TWLC changes into the future TWLC, which may not only change its position and shape as compared with the current TWLC, but also the dBZ values of the points it includes may also change. Therefore, in this step, specifically, the current moving speed components of the dBZ points in the TWLC are calculated, which may be denoted as u(x, y), v(x, y), wherein u is the speed component on the abscissa axis in the horizontal plane, and v is the speed component on the ordinate axis in the horizontal plane. The current moving speeds and their components of the dBZs in the TWLC may be calculated by observing the overall displacement of the TWLC at the current time as compared with the previous time.

Then, the moving speed components of the dBZ points in the TWLC at a next time may be forecasted based on the following equations in the gradient-based optical flow algorithm:

$$u_{n+1} = \bar{u}_n - E_x[E_x\bar{u}_n + E_y\bar{v}_n + E_t]/(\alpha^2 + E_x^2 + E_y^2),$$

$$v_{n+1} = \bar{v}_n - E_y[E_x\bar{u}_n + E_y\bar{v}_n + E_t]/(\alpha^2 + E_x^2 + E_y^2). \quad (1)$$

wherein, $E_x$, $E_y$, and $E_t$ are the gradients, i.e., the partial derivative components obtained at sub-step 2):

$$E_x = \frac{\partial dBZ(x, y, t)}{\partial x}, E_y = \frac{\partial dBZ(x, y, t)}{\partial y}, E_t = \frac{\partial dBZ(x, y, t)}{\partial t}, \quad (2)$$

n and n+1 denote two successive times, e.g., the current time and the next time;

$\bar{u}$ and $\bar{v}$ denote an average speed components of a point and its surrounding points, e.g., the average speed components of a point and its surrounding four points;

α is an adjustment constant, and a greater value thereof will result in a smoother flow; α may be obtained using historical data, i.e., its value may be obtained by putting the speed components and gradient values at a previous time and the current time into formula (1).

Formula (1) may be executed iteratively for the entire period from the current time to some future time (e.g., about 30 minutes or 1 hour later), so that the moving speed components of the dBZ points in the TWLC at each moment in the time period may be forecasted. In this way, by simply adding up, the position of each dBZ point in the TWLC at the future time as compared with that at the current time may be obtained.

Sub-step 4): forecasting future dBZ intensities using a random probability algorithm. Specifically, the future dBZ intensities may be forecasted using the following formula:

$$\frac{\partial dbz}{\partial t}\bigg|^{t3}_{\uparrow} = \frac{\partial dbz}{\partial t}\bigg|^{t2}_{\uparrow} P_{\uparrow\uparrow} + \frac{\partial dbz}{\partial t}\bigg|^{t2}_{\downarrow} P_{\downarrow\uparrow} \quad (3)$$

$$\frac{\partial dbz}{\partial t}\bigg|^{t3}_{\downarrow} = \frac{\partial dbz}{\partial t}\bigg|^{t2}_{\uparrow} P_{\uparrow\downarrow} + \frac{\partial dbz}{\partial t}\bigg|^{t2}_{\downarrow} P_{\downarrow\downarrow}$$

The formula may be written in matrix as follows:

$$\left[\frac{\partial dbz}{\partial t}\bigg|^{t3}_{\uparrow}, \frac{\partial dbz}{\partial t}\bigg|^{t3}_{\downarrow}\right] = \left[\frac{\partial dbz}{\partial t}\bigg|^{t2}_{\uparrow}, \frac{\partial dbz}{\partial t}\bigg|^{t2}_{\downarrow}\right] \cdot \begin{bmatrix} P_{\uparrow\uparrow} & P_{\uparrow\downarrow} \\ P_{\downarrow\uparrow} & P_{\downarrow\downarrow} \end{bmatrix} \quad (4)$$

wherein $$\frac{\partial dbz}{\partial t}\bigg|^{t3}_{\uparrow}$$

denotes the probability that the dBZ intensity increases at time t3;

$$\frac{\partial dbz}{\partial t}\Big|_{\downarrow}^{t3}$$

denotes the probability that the dBZ intensity decreases at time t3;

$$\frac{\partial dbz}{\partial t}\Big|_{\uparrow}^{t2}$$

denotes the probability that the dBZ intensity increases at time t2;

$$\frac{\partial dbz}{\partial t}\Big|_{\downarrow}^{t2}$$

denotes the probability that dBZ intensity decreases at time t2;

$$\begin{bmatrix} P_{\uparrow\uparrow} & P_{\uparrow\downarrow} \\ P_{\downarrow\uparrow} & P_{\downarrow\downarrow} \end{bmatrix}$$

is a state transition probability matrix, wherein P↑↑ denotes the probability that the dBZ intensity increase at some time and still increases at the next time; P↓↑ denotes the probability that the dBZ intensity decreases at some time and increases at the next time; P↑↓ denotes the probability that the dBZ intensity increases at some time and decreases at the next time; and P↓↓ denotes the probability that the dBZ intensity decreases at some time and still decreases at the next time.

It may be seen that according to above formula (3) or (4), the probability that the dBZ increases or decreases at time t3 is only related to the state probability (i.e., the probability of increasing and the probability of decreasing) at time t2 and the state transition probability matrix. The state transition probability matrix may be obtained from historical observation statistical data, that is, obtained by observing and counting the cases that the dBZ increases or decreases at some time within a previous time period and the cases that it increases or decreases at the next time.

When using formula (3) or (4) to forecast a future dBZ intensity, since the probability that the dBZ intensity at the current time is increasing or decreasing is already known (e.g., by comparing the observed dBZ at the current time and the dBZ at the previous time), the probability of its increasing or decreasing at the current time is 1, and the probability of its decreasing or increasing at the current time is 0. Thus, using formula (3) or (4), the probability that the dBZ increases or decreases at the next time may be obtained. The probability that the dBZ increases or decreases at some future time (e.g., about 30 minutes or 1 hour later) may be obtained by iteratively executing formula (3) or (4) for the entire period from the current time to the future time. If the probability that the dBZ increases is greater than the probability that it decreases at the future time, it may be considered that the dBZ increases at the future time; otherwise, it may be considered that the dBZ decreases at the future time.

Next, multiplying the change rate over time of the dBZ, $$E_t = \frac{\partial dBZ(x, y, t)}{\partial t},$$

by the time length from the current time to the future time, the amplitude of increasing or decreasing of the dBZ may be obtained, so as to get the dBZ intensity at the future time. It should be noted that the above process is performed for each dBZ point in the TWLC identified in step 1, so that the intensity of each dBZ point at the future time may be forecasted. That is to say, the position of each dBZ point in the identified TWLC at the future time is forecasted in sub-step 3), and the intensity of each dBZ point in the identified TWLC at the future time is forecasted in sub-step 4), so that the TWLC state at the future time is forecasted from the identified TWLC.

Returning to FIG. 1, step 3: building or updating an SDA model based on SDA observation data and detected TWLC state-related data. Both the SDA observation data and the TWLC state-related data may be historical data. That is to say, the SDA model may be built using previously detected TWLC state-related data and SDA observation data in the TWLC, and the built SDA model may be updated using newly detected TWLC state data and SDA observation data in the TWLC. Step 3 may usually be performed before steps 2 and 1, so as to use historical data of TWLC and SDA to build or update the SDA model; the step may also be performed after or concurrently with steps 2 and 1, so as to use the currently observed TWLC and SDA data to build or update the SDA model.

In an embodiment of the present invention, the SDA model is a logistic regression model, which reflects the relationships between TWLC state-related variables and the SDA occurrence probability. The TWLC state variables may be selected from various variables reflecting the TWLC state. For example, the top height of the reflectivity (HR) (i.e., the top height of all the dBZ points in an identified TWLC area) and the vertical integrated liquid water (VIL) are closely related to the SDA frequency. When the first SDA occurs, HR reaches 9 km and VIL reaches above 25 kg/m². Therefore, HR and VIL may be included in the SDA model as TWLC state variables. As another example, whether the top height of 45 dBZ reaches 7 km is a necessary indicator of SDA, and thus the reflectivity at 7 km height (R7) (i.e., the dBZ value at the 7 km height) may also be included in the SDA model as a TWLC state variable.

In an embodiment of the present invention, the TWLC state-related parameters as the input of the SDA model include the central position of high reflectivity (SC) (i.e., position of the greatest dBZ point in the identified TWLC), the top height of reflectivity (HR), the vertical integrated liquid water (VIL), and the reflectivity at 7 km height (R7).

The SDA model may be expressed in the following formula:

$$L = L(SC, HR, VIL, R7)$$

$$L = a*SC + b*HR + c*VIL + d*R7. \quad (5)$$

wherein L denotes the probability of SDA occurrence, and a, b, c and d are model parameters. The model parameters may be obtained by training the model, that is, values of the parameters a, b, c and d may be obtained by putting historical observation data of the state variables SC, HR, VIL, and R7 of previous TWLCs and SDA occurrence frequencies into formula (5).

Of course, as known by those skilled in the art, the SDA model may also includes more, less or different variables. For example, the SDA model may only includes some of the state variables SC, HR, VIL, and R7. In addition, as known by those skilled in the art, other predication models than the logistic regression model may also be feasible.

Step 4: calculating the probability of producing SDA in the forecasted future TWLC according to the SDA model.

In this step, values of the state variables SC, HR, VIL, and R7 may be obtained from the future TWLC forecasted in step 2, and then they may be put into formula (5) to get the probability of SDA occurrence.

The above steps may be executed iteratively, that is, when the future time arrives, a TWLC may be identified based on new radar data, from the newly identified TWLC, a future TWLC may be further forecasted, and the SDA model may be updated using the actually observed state variables SC, HR, VIL, and R7 of the TWLC and the SDA occurrence frequency. Then, the probability of producing SDA in the further forecasted future TWLC may be calculated according to the updated SDA model.

Above is described the steps of lightning forecast method according to embodiments of the present invention by referring to the accompanying drawings. It should be pointed out that the above description is merely example, rather than restriction to the present invention. In other embodiments of the present invention, the method may have more, less or different steps, and the relationships of sequence, inclusion etc. among the steps may be different from that is described and illustrated.

Figure 3:
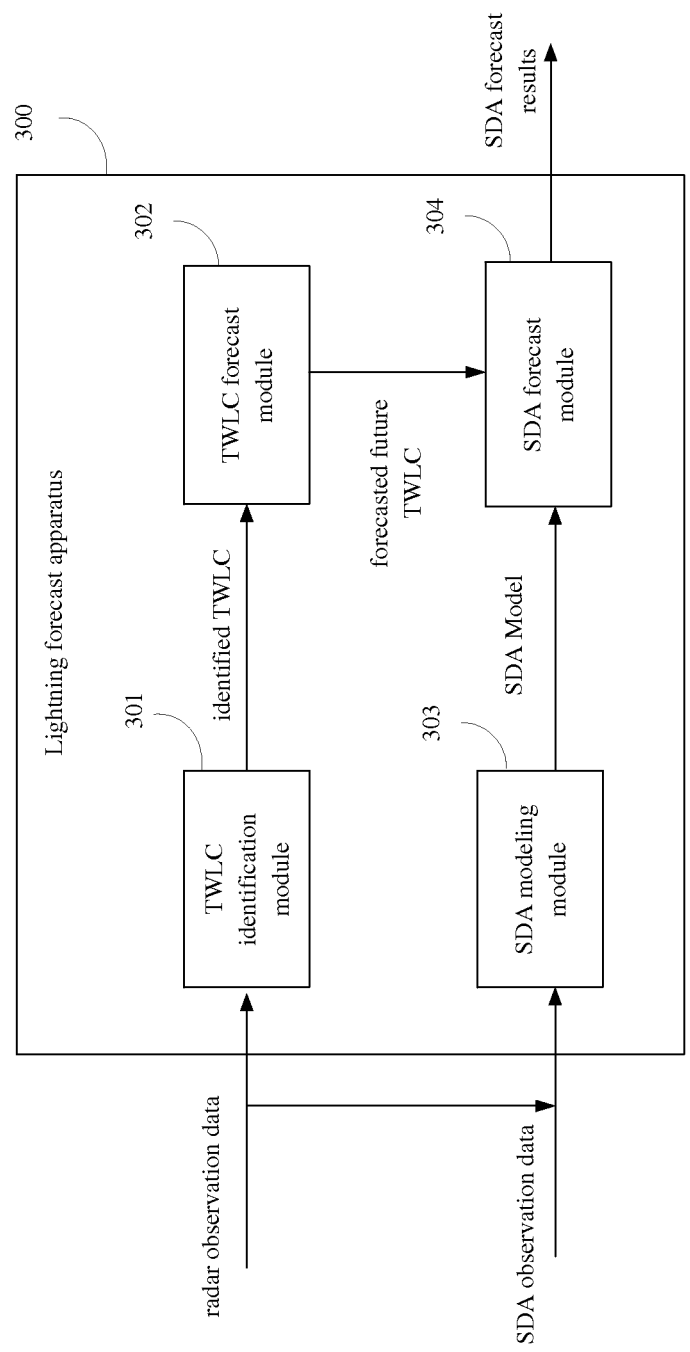
FIG. 3 shows a lightning forecast apparatus according to an embodiment of the present invention.

Now referring to FIG. 3, it shows a lightning forecast apparatus according to an embodiment of the present invention. The operations performed by the forecast apparatus correspond to the steps of the lightning forecast method described above. In the following will be described briefly the components and their operations of the lightning apparatus by referring to FIG. 3, and reference may be made to the above description for more details of the operations.

As shown in FIG. 3, the lightning forecast apparatus 300 comprises: a TWLC identification module 301 configured to identify a Targeted Weather of SDA Carrier (TWLC) based on detected radar reflectivity data; a TWLC forecast module 302 configured to forecast a future TWLC state based on the identified TWLC; a SDA modeling module 303 configured to build or update an SDA model based on SDA observation data and detected TWLC state-related data; and a SDA forecast module 304 configured to calculate the probability of producing SDA in the forecasted future TWLC according to the SDA model.

According to an embodiment of the present invention, the TWLC identification module comprises: a first identification sub-module configured to identify an area with radar reflectivity greater than about 35 db; a second identification sub-module configured to identify an area with radar reflectivity greater than about 45 db; and an extending sub-module configured to extend from the area with radar reflectivity greater than about 45 db to the area with radar reflectivity greater than about 35 db until the radar reflectivity is about 35 db, so as to identify the extended area with radar reflectivity greater than about 45 db as the TWLC.

According to an embodiment of the present invention, the TWLC predication module 302 comprises: a dBZ distribution obtaining sub-module configured to obtain the dBZ distribution at a previous time and the current time in the identified TWLC; a partial derivative component calculating sub-module, configured to calculate partial derivative components of the dBZ distribution in the TWLC based on the dBZ distribution at the previous time and the current time; a dBZ position forecast sub-module configured to forecast future dBZ distribution moving speeds and moving directions by using a gradient-based optical flow algorithm based on the partial derivative components of the dBZ distribution, so as to obtain future dBZ positions; a dBZ intensity forecast sub-module configured to forecast future dBZ distribution intensities according to a random probability model.

According to an embodiment of the present invention, the random probability model assumes that a future dBZ state probability is only related to the current dBZ state probability and state transition probability matrix.

According to an embodiment of the present invention, the SDA model is a logistic regression model, and the input of the model is one or more of the following TWLC state-related data: the strong reflectivity center; the top height of reflectivity; the vertical integrated liquid water; and the reflectivity at 7 km height.

Above is described the lightning forecast apparatus according to embodiments of the present invention. It should be pointed out that the above description is merely exemplary, rather than restriction to the present invention. In other embodiments of the present invention, the apparatus may have more, less or different modules, and the relationships of inclusion, connection, function etc. among the modules may be different from that is described or illustrated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that may contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that may communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that may direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 4:
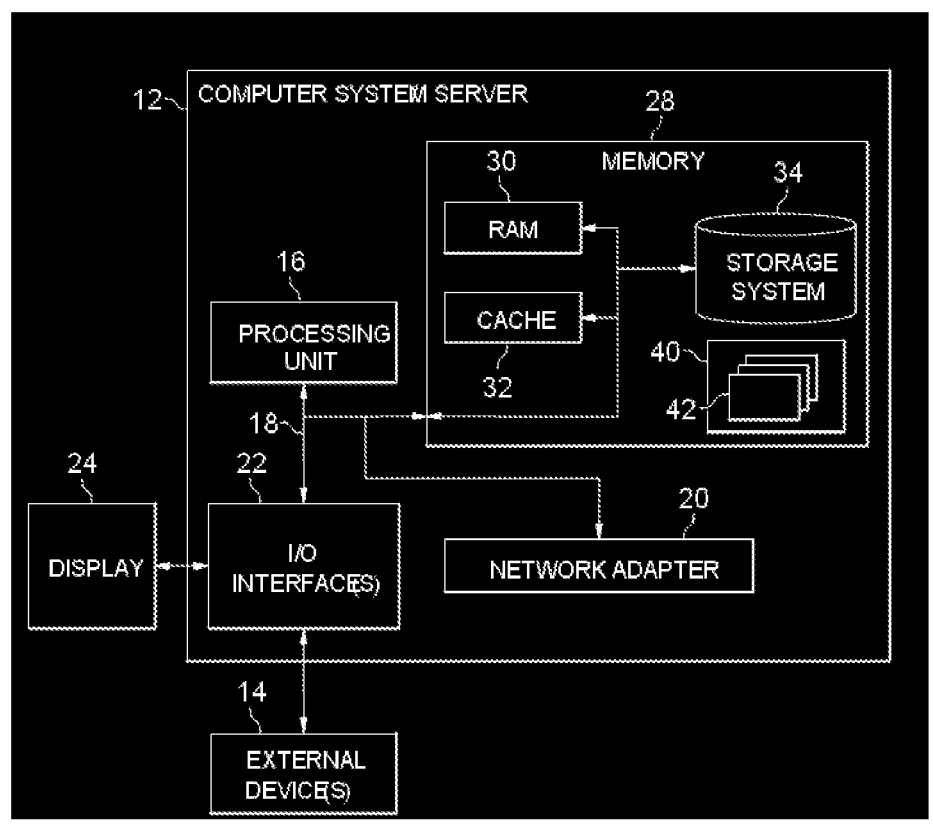
FIG. 4 shows a block diagram of an exemplary computer system/server 12 adapted to implement embodiments of the present invention.

Referring now to FIG. 4, in which an exemplary computer system/server 12 which is applicable to implement the embodiments of the present invention is shown. Computer system/server 12 is only illustrative and is not intended to suggest any limitation as to the scope of use or functionality of embodiments of the invention described herein.

As shown in FIG. 4, computer system/server 12 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 may include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 may be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media may be provided. In such instances, each may be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication may occur via Input/Output (I/O) interfaces 22. Still yet, computer system/server 12 may communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, may be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A lightning forecast method, comprising:
    receiving historical lightning data and historical radar reflectivity data;
    building or updating a Spark Discharge of Air (SDA) model based on the historical lightning data and on radar reflectivity factors, the radar reflectivity factors being generated from the historical radar reflectivity data, the SDA model defining a relationship between the radar reflectivity factors and probability of lightning occurring;
    receiving current radar reflectivity data;
    identifying a current Targeted Weather of SDA Carrier (TWLC) area based on the current radar reflectivity data, identifying the current TWLC area by comparing the current radar reflectivity data against one or more radar reflectivity thresholds to identify a geographic zone with a higher probability of lightning occurring, the comparison comprising:
        identifying a first area where the current radar reflectivity data is greater than a first radar reflectivity threshold;
        identifying a second area where the current radar reflectivity data is greater than a second radar reflectivity threshold; and
        identifying the geographic zone with a higher probability of lightning occurring by extending from the second area where the current radar reflectivity is greater than the second radar reflectivity threshold to the first area where the current radar reflectivity data is greater than the first radar reflectivity threshold until the current radar reflectivity data is at the first radar reflectivity threshold;
    forecasting a future TWLC area based on the current TWLC area, forecasting the future TWLC area by evaluating the historical radar reflectivity data and current radar reflectivity data within at least a portion of the current TWLC area;
    forecasting future radar reflectivity data within the at least one portion of the current TWLC area;
    generating forecasted radar reflectivity factors based on the future radar reflectivity data;
    using the forecasted radar reflectivity factors and the SDA model to generate a forecasted probability of lightning occurring in the forecasted future TWLC area; and
    outputting the forecasted probability of lightning occurring in the forecasted future TWLC area to the user.

2. The method of claim 1, wherein the forecasting a future TWLC area based on the current TWLC area further comprises:
    obtaining a historical radar reflectivity distribution and a current radar reflectivity distribution in the current TWLC area based on the historical radar reflectivity data and the current radar reflectivity data;
    calculating partial derivative components of the historical radar reflectivity distribution and the current radar reflectivity distribution in the current TWLC area based on the historical radar reflectivity distribution and the current radar reflectivity distribution;
    forecasting a future radar reflectivity distribution moving speeds and a future radar reflectivity distribution moving directions by using a gradient-based optical flow algorithm based on the partial derivative components of the historical distribution and the current radar reflectivity distribution in the current TWLC area, so as to obtain a future radar reflectivity distribution positions; and
    forecasting the future radar reflectivity distribution data according to a random probability model.

3. The method of claim 2, where in the random probability model assumes that a future radar reflectivity distribution state probability is only related to a current radar reflectivity distribution state probability and a state transition probability matrix.

4. The method of claim 1, where the identifying the TWLC area, the identifying the first area the identifying the second area, the identifying the geographic zone, the forecasting the future TWLC area, the forecasting the future radar reflectivity data, the building or updating, and the calculating are performed in loops.

5. The method of claim 1, wherein an input of the SDA model is a strong reflectivity center.

6. The method of claim 1, wherein an input of the SDA model is a top height of reflectivity.

7. The method of claim 1, wherein an input of the SDA model is a vertical integrated liquid water.

8. The method of claim 1, wherein an input of the SDA model is a reflectivity at 7 km height.

* * * * *